United States Patent [19]

Kwok

[11] Patent Number: 4,863,879
[45] Date of Patent: Sep. 5, 1989

[54] METHOD OF MANUFACTURING SELF-ALIGNED GAAS MESFET

[75] Inventor: Siang P. Kwok, Colorado Springs, Colo.

[73] Assignee: Ford Microelectronics, Inc., Colorado Springs, Colo.

[21] Appl. No.: 133,913

[22] Filed: Dec. 16, 1987

[51] Int. Cl.$^4$ .................... H01L 21/44; H01L 21/265
[52] U.S. Cl. ......................................... 437/41; 437/44; 437/176; 437/184; 437/192; 437/238; 437/241; 437/245; 437/912; 437/944; 357/15; 357/22; 156/643; 156/653; 156/659.1
[58] Field of Search ...................... 437/44, 40, 41, 176, 437/177, 184, 187, 192, 235, 238, 241, 243, 245, 912, 189, 944; 357/15, 22 I; 156/643, 653, 659.1

[56] References Cited

U.S. PATENT DOCUMENTS

| 4,532,004 | 7/1985 | Akiyama et al. | 437/176 |
| 4,569,119 | 2/1986 | Terada et al. | 437/228 |
| 4,728,621 | 3/1988 | Graf et al. | 437/41 |
| 4,745,082 | 5/1988 | Kwok | 437/176 |

OTHER PUBLICATIONS

Ghandhi, *VLSI Fabrication Principles*, John Wiley and Sons, 1983, pp. 353–354.
Kwok, "Comparison of Low-Temperature and High-Temperature Refractory Metal/Silicides Self-Aligned Gate on GaAs", presented at the Workshop on Refractory Metals and Silicides for VLSI IV, San Juan Bautista, CA, May 12–15, 1986.

Primary Examiner—Brian E. Hearn
Assistant Examiner—M. Wilczewski
Attorney, Agent, or Firm—Antonelli, Terry & Wands

[57] ABSTRACT

A self-aligned MESFET is formed by implanting a first (channel) region in a first surface portion of a gallium arsenide substrate. A dielectric layer is formed on the surface of the substrate and portions of this layer are selectively removed, to leave a relatively thick substitutional gate mesa overlying a first surface portion of the first region and a relatively thin protective portion, contiguous with the substitutional gate, overlying a second surface portion of the first region, so that the substitutional gate has sidewalls extending above the protective portion. Sidewall spacers are formed contiguous with the sidewalls of the substitutional gate, so as to overlie surface portions of the protective portion of the dielectric layer contiguous with the substitutional gate. Ions are implanted into the substrate using the substitutional gate and the sidewall spacers as a mask, thereby forming source and drain regions in the first region. The structure is annealed and the substitutional gate and sidewall spacers are removed. A conductive gate layer is formed on the first region in place of the removed substitutional gate and apertures are formed in the reduced thickness portion of the dielectric layer to expose surface portions of the source and drain regions. Ohmic contacts are connected to the source and drain regions through the apertures.

21 Claims, 4 Drawing Sheets

METHOD OF MANUFACTURING SELF-ALIGNED GAAS MESFET

FIELD OF THE INVENTION

The present invention relates in general to the manufacture of semiconductor devices, and is particularly directed to a method for manufacturing a Schottky gate type field effect transistor containing III–V compound semiconductor material, such as GaAs, using self-alignment, substitutional gate processing.

BACKGROUND OF THE INVENTION

The continuing demand for higher signal processing speeds and bandwidths in microminiaturized electronic circuit components has been accompanied by the application of semiconductor materials other than silicon to a variety of integrated circuit architectures. Currently foremost among the materials are III–V semiconductor compounds, particularly GaAs, which has a demonstrated ability to not only meet speed and bandwidth performance criteria, but inherently possesses a significant radiation hardness capability, thereby making GaAs-resident signal processing architectures especially attractive in aerospace environments.

Unfortunately, the performance advantage enjoyed by devices implemented in GaAs substrates is accompanied by a significant cost penalty due to the relatively low yield and poor predictability of electronic characteristics of GaAs chips. This lack of precision in GaAs chip processing methodologies also limits circuit integration density, so that a practical application of submicron processing techniques has not been effectively feasible in a GaAs environment.

Proposals to deal with these problems have been addressed in the literature and most recently have included self-aligned source/drain MESFET processes, as described, for example, in the U.S. Pat. No. 4,532,004 to Akiyama et al, and self-aligned substitutional gate MESFET processing, as described, for example, in the U.S. Pat. No. 4,569,119 to Terada et al..

In my copending U.S. Pat. No. 4,745,082, filed June 12, 1986, and issued May 17, 1988, entitled "Method of Making Self-Aligned MESFET Using a Substitutional Gate With Sidewalls" and assigned to the Assignee of the present application, there is described an improved substitutional gate MESFET processing methodology involving the formation of sidewall spacers contiguous with the substitutional gate (and self-aligned metal gate) to accurately control the channel length of the Schottky gate region and the performance characteristics of the device, while still maintaining the inherent self-aligned location of the gate metal in place of the "dummy" gate material. Now, although such an improved process results in a device having improved performance characteristics, the effective yield obtained remains diminished due to the potential for contamination of the surface of the GaAs substrate during processing steps subsequent to the formation of the 'dummy' gate. Specifically, during the dry (reactive ion) etching of layers atop the surface of the GaAs substrate, the surface of the GaAs substrate is subjected to induced radiation damage by the ions in the plasma; in addition, the etching atmosphere contains contaminants (e.g. extremely light hydrogen ions and heavy metal ions such as Mg, Fe and Cr) that readily adhere to or penetrate the substrate surface, lodge themselves (form interstitial discontinuities) in the substrate and diffuse rapidly during subsequent high temperature annealing. Because these contaminants diffuse rapidly in GaAs and are electrically active, they can migrate into active device areas and spuriously compensate the electrical activation of the device, thereby reducing the yield of the wafer batch in which the chip containing the device is formed. Moreover, radiation damage to the GaAs surface may not be completely recoverable, further reducing the yield.

SUMMARY OF THE INVENTION

In accordance with the present invention, the abovedescribed yield-impacting potential of (ionic) impurities present in the atmosphere above the semiconductor substrate surface during device formation is obviated by a new and improved processing methodology which effectively protects the surface of the substrate throughout the process of forming a self-aligned MESFET through substitutional gate processing. Pursuant to the present invention, the self-aligned MESFET is formed by implanting a first semiconductor region of a prescribed conductivity type in a first surface portion of a gallium arsenide substrate whereat the channel and source and drain regions adjacent thereto are to reside. After the implanted region has been annealed, a first relatively thick (e.g. 7000 Å) dielectric layer (e.g. silicon dioxide) of which the substitutional gate is to be formed is non-selectively deposited on the surface of the substrate. This thick dielectric layer is then selectively etched, so as to leave a substitutional gate mesa portion having a first thickness (7000 Å) overlying a first surface portion of the first semiconductor (channel) region and a relatively thin (500–1000 Å) protective portion, contiguous with the substitutional gate portion, overlying a second surface portion of the first semiconductor region, contiguous with the first surface portion, and a second surface of the substrate contiguous with said first surface portion, so that the substitutional gate portion of the dielectric layer has sidewalls extending above the protective portion of the dielectric layer.

After selectively etching the thick dielectric layer to form the respective thick and thin portions, sidewall spacers contiguous with the sidewalls of the substitutional gate portion of the dielectric layer are formed by non-selectively depositing a uniformly thick insulator layer over the selectively etched dielectric and then subjecting this deposited insulator layer to a reactive ion etch. The reactive ion etch of the deposited insulator layer leaves sidewall spacers contiguous with the sidewalls of the substitutional mesa gate and overlying surface portions of the protective portion of the dielectric layer contiguous with its substitutional gate portion. Next, source and drain regions are formed by implanting ions into the substrate using the substitutional gate portion, the sidewall spacers and material of the protective portion of the dielectric layer beneath the sidewall spacers as a mask. The sidewall spacers are removed and the resulting structure is then annealed.

A planarizing layer is formed to the level of the top of the substitutional gate portion of the dielectric layer and, using the planarizing layer as a mask, the substitutional gate is etched away, leaving an aperture through the planarizing layer and the thin portion of the dielectric. A metal layer is then non-selectively deposited over the resulting structure to form a gate layer on the first surface portion of the first semiconductor region, self-aligned with the source and drain regions. The planarizing layer and the metal deposited thereon are then lifted off the dielectric layer so as to leave the metal that has deposited on the surface of the substrate through the aperture as the gate layer of the device. Next contact apertures are formed in the protective portion of the dielectric layer to expose surface portions of the source and drain regions. Ohmic contacts are then connected to the source and drain regions through the apertures in the dielectric.

In the process according to the present invention, by not having completely etched through the substitutional gate-forming dielectric layer at portions adjacent to the mesa, so as to leave a thin protective portion on the order of 500–1,000 Å, the entirety of the surface of the substrate is protected during subsequent device processing, including the reactive ion etch through which the sidewall spacers are formed. By completely etching through the thickness of the non-selectively deposited insulator layer of which the sidewall spacers are formed (except, of course, for the sidewall spacers themselves) those portions of the first (channel) region whereat source and drain regions are ion implanted will not be masked by a layer of substantial thickness that would otherwise require increased implantation energy, but rather are protected by the reduced thickness (500–1,000 Å) portions of the dielectric layer, thereby affording the use of reduced implantation energies and improving the practicality of the process. This enhancement provided by the configuration of the substitutional gate dielectric layer is buttressed by the fact that the dielectric layer is formed of the same material throughout, thereby simplifying the process step sequence and controllability of device formation.

DETAILED DESCRIPTION

The present invention will now be described with reference to FIGS. 1–11 which are respective cross-sectional views of a MESFET at respective steps of its manufacture.

Figure 1:
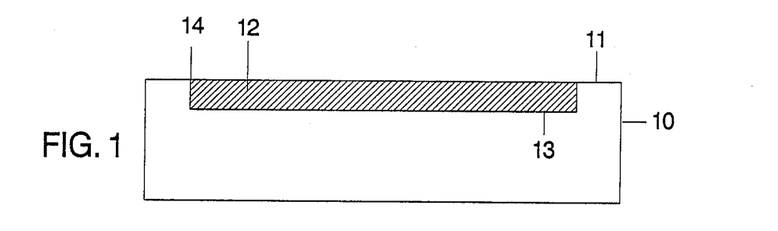
FIGS. 1–11 are cross-sectional views of a MESFET structure at respective steps of its manufacture using the manufacturing process in accordance with the present invention.

Initially as shown in FIG. 1, there is provided a substrate 10 of semi-insulating semiconductor material, such as a Group III–V semiconductor compound (e.g. gallium arsenide or indium phosphide) or a film of any of these atop another substrate, such as glass, mylar or stainless steel. In accordance with a preferred embodiment of the invention, the material of which substrate 10 is made is gallium arsenide. Substrate 10 has a top planar surface 11 in which there is formed an impurity region 12 (in which the channel region of the MESFET will reside) having a bottom portion 13 and side portions 14 extending from the bottom portion 13 to the planar surface 11. Surface (channel) region 12 is preferably formed by the ion implantation of impurities (such as Se, Si, Be and Mg) of a prescribed conductivity type, (n, n+, n−, p or p+), to define the conductivity of a channel of a prescribed mode FET device, such as a depletion mode device (e.g. n channel device) or enhancement mode device (e.g. n− channel device) in the GaAs substrate 10. After the implantation of the region 12, the structure is annealed at a temperature from about 800° to 950° C. to heal lattice damage and activate the implanted impurity species.

Figure 2:
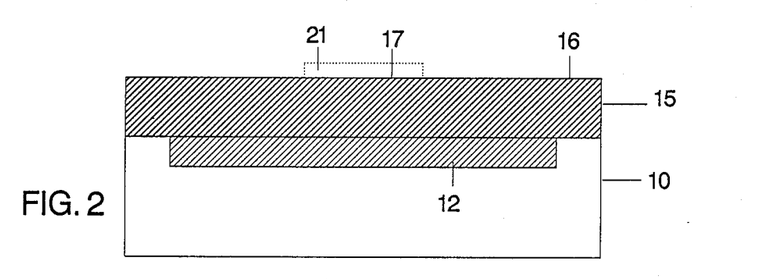

Next, as shown in FIG. 2, a layer 15 of insulator material, such as silicon dioxide, silicon nitride, or aluminum nitride, is deposited on planar surface 11 of substrate 10. This insulator or layer "dummy dielectric" layer 15 is to be employed for the formation of the substitutional ("dummy") gate. For this purpose, a layer of photoresist shown in broken lines 21 is selectively formed on the top surface 16 of the dielectric layer 15 so as to overlie a surface portion 17 thereof located above the implanted surface region 12. The thickness of dummy dielectric layer 15 is preferably on the order of 5,000–7,000 Å so as to provide a mask against implantation of ions to form source and drain regions adjacent a substitutional gate and to minimize mechanical stress between the substitutional gate portion of layer 15 and the substrate 10 therebeneath.

Figure 3:
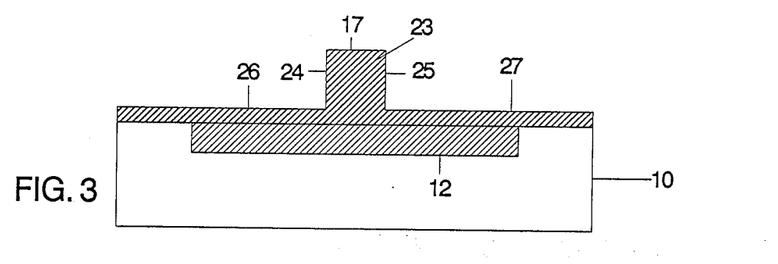

Using the protective photoresist layer 21 as a mask, dummy dielectric insulator layer 15 is preferably dry etched, as shown in FIG. 3, using, for example $SF_6$ gas, so as to leave a relatively thick (5,000–7,000 Å) mesa portion 23 having sidewalls 24 and 25 which extend above a relatively thin (500–1,000 Å) protective layer portion shown at 26 and 27 overlying the substrate 10 and a portion of the surface region 12. (As will be described below, the mesa portion 23 of the dummy dielectric layer 15 is used to define the location of gate metal which will form a Schottky barrier with the surface of the implanted region 12.)

By reducing the thickness of layer 15 to 500–1,000 Å adjacent to mesa portion 23, portions 26 and 27 will be sufficiently thick to prevent contaminant penetration into and radiation damage to the substrate during dummy gate formation and subsequent reactive ion etching to form sidewall spacers but thin enough to allow source and drain region ion implantation. Namely, in an ion implantation process where target regions of a substrate are coated with an insulator film, such as silicon nitride, it is important that the insulator film not be so thick (e.g. substantially greater than 1000 Å) as to detrimentally affect the characteristics of the implanted ion regions; the thicker the film, the higher implant energy required for forming the target region. Unfortunately, the use of high implant energies gives rise to lateral straggling of the implanted ions, which prevents accurate control of gate geometry. Accordingly, where a protective film is retained on the surface of the substrate, its thickness is typically no greater than a value on the order of only several hundred angstroms in order to afford the use of reasonably low implant energies and thereby achieve a procession gate geometry. However, such an extremely thin film does not offer sufficient protection against contaminant penetration and radiation damage, described above. The above range of thickness of portions 26 and 27 of layer 15 avoids both the implant energy problem and the contaminant introduction/radiation damage problem.

Figure 4:
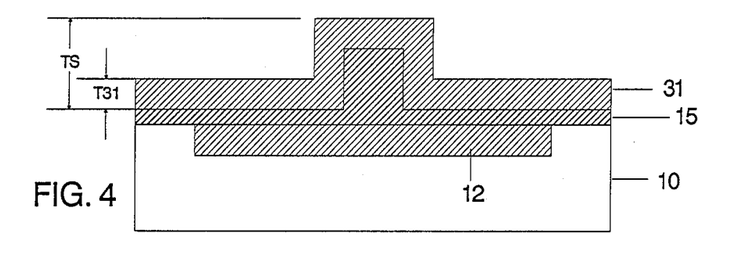

Next, as shown in FIG. 4, an additional layer of dielectric material, such as silicon dioxide, silicon nitride, polymers, aluminum nitride and photoresist, having a thickness $T_{31}$ on the order of 10 nm to 400 nm is non-selectively deposited over the entire surface of the selectively dummy dielectric layer 15. Preferably dielectric layer 31 is made of a material which etches considerably faster than does dummy dielectric layer 15 (e.g. an etching ratio of 20:1) when exposed to a prescribed etchant, e.g. a reactive ion etch, so as to facilitate the formation of sidewall spacers contiguous with sidewalls 24 and 25 of mesa 23, as will be described below. For this purpose, in the present example, where dielectric layer 15 is made of silicon dioxide, layer 31 may be made of silicon nitride.

Figure 5:
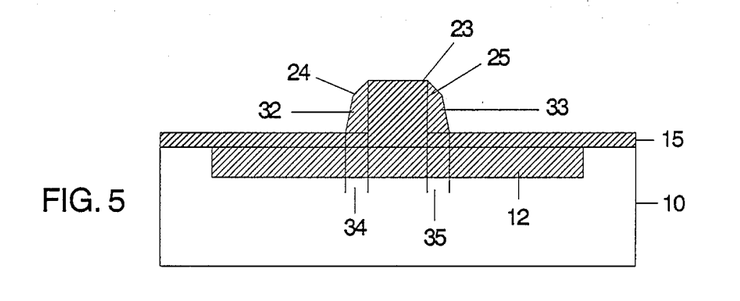

Following the formation of layer 31 atop dielectric layer 15, dielectric layer 31 is subjected to a reactive ion etch process (for example using $CF_4 + O_2$ at a partial pressure of 50 mTorr for a period of three minutes) so as to etch completely through the thickness $T_{31}$ of the dielectric layer 31, as shown in FIG. 5. Because of the substantial thickness $T_S$ of that portion of dielectric layer 31 contiguous with the sidewalls 24 and 25 of the mesa portion 23 of dielectric layer 15, upon completion of the etching through the thickness $T_{31}$ of the dielectric layer 31 there remain a pair of tapered sidewall spacers 32 and 33 which are contiguous with sidewalls 24 and 25 of mesa portion 23 and overlap the surface of the dummy dielectric layer 15 adjacent to mesa portion 23 at surface regions 34 and 35, as shown. The distances (widths of surface regions 34 and 35) by which spacers 32 and 33 extend beyond the sidewalls 24 and 25 of the mesa portion 23 of the dummy dielectric define the separation of the source and drain regions from the eventual location of the gate which will occupy the location of the mesa portion 23 of dielectric layer 25 and contact the surface of region 12. As noted above, because of the considerably higher etching rate of spacer layer 31 to the reactive ion etch, as compared with that of dielectric layer 15, layer 31 can be completely etched down to the surface of layer 15 without effective degradation of the surface of layer 15.

In accordance with the present invention, by not having completely etched through the dummy dielectric layer 15 at portions adjacent the mesa 23, namely leaving a thickness T11 on the order of 500-1,000 Å at portions 26 and 27, as shown in FIG. 3, described above, the entirety of the surface of the substrate is protected during subsequent device processing, including the reactive ion etching step through which sidewall spacers 32 and 33 are formed described above with reference to FIG. 5. By completely etching through thickness of insulator layer 31 (except where sidewall spacers 32 and 33 remain) those portions of region 12 whereat source and drain regions are to be ion-implanted will not be masked by a layer of substantial thickness that would otherwise require increased implantation energy and increased lateral straggling of the implanted ions, but rather are protected by the reduced thickness (500-1,000 Å) portions 26 and 27 of insulator layer 15, so as to permit the use of reduced implantation energies and thereby improve device short-channel-effect immunity and the the practicality of the process. This enhancement provided by the configuration of insulator layer 15 is further underscored by the fact that layer 15 is formed of the same material throughout, thereby simplifying the process step sequence and controllability of device formation.

As pointed out briefly above, the atmosphere above the substrate during reactive ion etching processing contains contaminants, such as light hydrogen ions and heavy metal ions, which would readily adhere to or penetrate into the substrate material but for the presence of portions 26 and 27 dielectric layer 15. By retaining dielectric layer 15 over the entire surface of the substrate, contaminant intrusion is prevented, so that the yield of the process can be improved.

Figure 6:
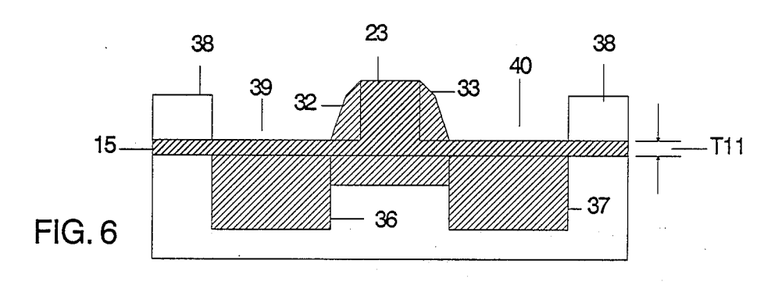

Next, as shown in FIG. 6, after formation of sidewall spacers 32 and 33 adjacent to mesa 23 of dielectric layer 15, a photoresist masking layer 38 is selectively formed over the surface of dielectric layer 15, and high impurity concentration source and drain regions 36 and 37 are formed in substrate 10 by ion implanting an impurity having a conductivity corresponding to that of region 12 (e.g. N+ impurities where channel region 12 of N conductivity type). This ion implantation step is preferably carried out by directing silicon ions at an implantation energy of 100 electron Volts in a direction normal to the service of the substrate to form respective (N+) source and drain regions 36 and 37 at a depth on the order of 1000 Å from the surface 11. During this step, the substitutional gate mesa 23 and sidewall spacers 32 and 33, as well as photoresist layer 38, provide a barrier or mask to the ion beam, so as to prevent the introduction of ions at those locations in the surface of the substrate 10 other than portions 39 and 40 where the reduced thickness portion T11 of the dielectric layer 15 is exposed between the selectively formed photoresist layer 38 and the side spacers 32 and 33 adjacent to the thick mesa portion 23.

Following the implantation of regions 36 and 37, the photoresist layer 38 and the sidewall spacers 32 and 33 adjacent to the sidewalls 24 and 25 of the mesa portion 23 of the dielectric layer 15 are removed, preferably by plasma etching, so as to leave only the dielectric layer 15 atop substrate 10. At this point, it is to be noted that the deeper source and drain regions 36 and 37 are separated from the sidewalls 24 and 25 of the mesa 23 by distances corresponding to surface regions 34 and 35 of the sidewall spacers 32 and 33, thereby guaranteeing that the eventual gate to be formed in place of the mesa portion 23 of dielectric layer 15 will be prevented from overlapping source and drain regions 36 and 37, so as to increase the breakdown voltage of the device. As noted previously, in accordance with the invention, because of the presence of portions 26 and 27 of the dielectric layer 15 adjacent to the mesa portion 23 thereof during the etching away of the sidewall spacers 32 and 33 and the photoresist layer 38, the introduction of contaminants into the substrate is prevented.

The structure is then annealed, preferably in an arsine environment over pressure at high temperature. In particular, the annealing may be performed at a temperature from about 750° to 1000° C. at an over pressure of arsine from about 0.005 to about 0.10 atmospheres. The annealing may be accomplished in a composite gas environment containing at least arsine for about 10 seconds to 60 minutes, preferably on the order of about 20 minutes.

Figure 7:
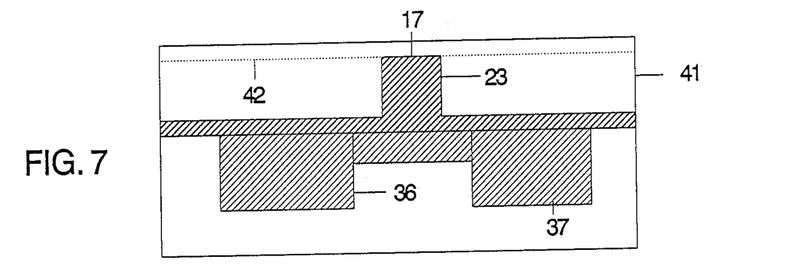

Next, as shown in FIG. 7, subsequent to the annealing step, a planarizing material such as a polymer, or photoresist, is applied as a conformal layer 41 over the dielectric layer 15. The planarizing layer 41 is then etched back to the level of the mesa portion 23 as shown by the broken line 42. This etch back exposes the top surface 17 of the mesa 23.

Figure 8:
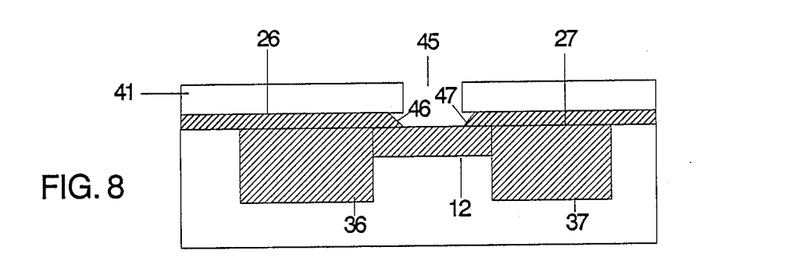

Following formation of planarizing layer 41, an etchant, such as buffered hydrofluoric acid, is non-selectively applied to the structure to etch the exposed dielectric layer 15 and remove the mesa portion 23 of the substitutional gate, as shown in FIG. 8. During this etching step, there is a slight undercut of dielectric layer 15 at the lower sidewalls 46 and 47 of the opening 45 from which the mesa portion 23 of the dummy dielectric has been removed. This etching step also maintains a planar character of the top surface 42 of layer 41. The slight undercutting of dielectric layer 15 at sidewalls 46 and 47 forms an angle of about 45° to 75°. This undercut into the reduced thickness portions 26 and 27 of the dummy layer 15 facilitates subsequent lift-off of the metal of which the gate is to be formed.

Figure 9:
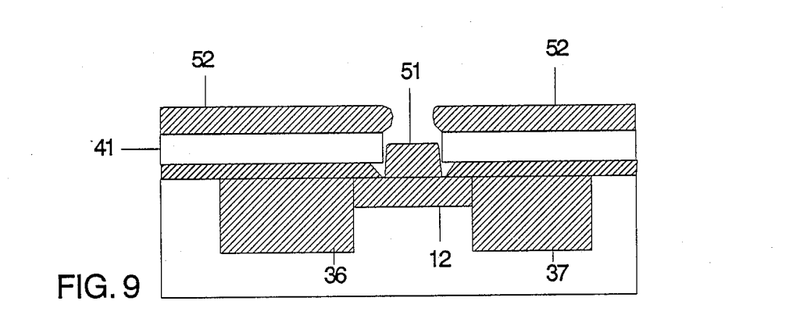

Next, as illustrated in FIG. 9, a refractory metal, such as Ti, TiW, Ta, MO and their silicides, or a composite Ti/Pt/Au, is nonselectively deposited on the structure resulting from the process step illustrated in FIG. 8, so as to form a Schottky barrier-forming gate layer 51, having a thickness on the order of 2500 Å, and surface metal layers 52 atop the planar surface 42 of layer 41. Because the sidewalls of the opening 45 through layer 41 conform with the sidewalls 24 and 25 of the mesa portion 23 of the dummy dielectric, the width of gate layer 51 will substantially conform with these dimensions but not overlie the source and drain regions 36 and 37.

Figure 10:
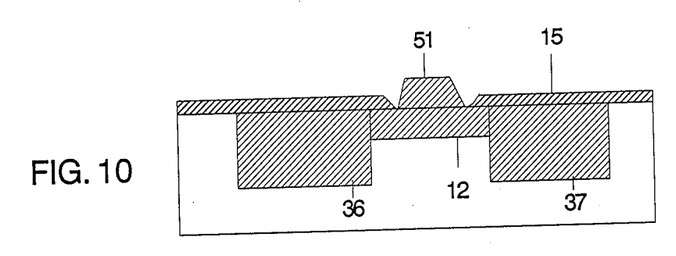

Following the deposition of the gate layer 51, the planarizing layer 41 is stripped away, by way of a conventional lift off technique, thereby removing the metal layers 52 thereatop, leaving only the gate layer 51 deposited on surface 11 of the substrate 10, as shown in FIG. 10.

Figure 11:
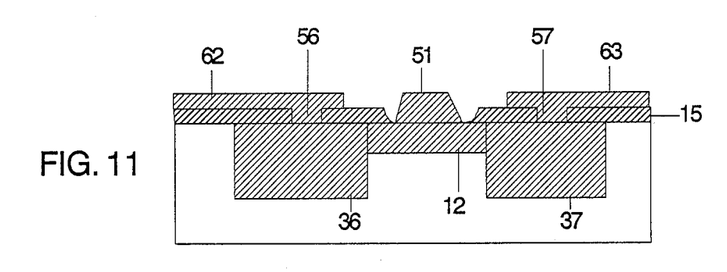

Next, as illustrated in FIG. 11, openings 56 and 57 are provided in the reduced thickness portions 26 and 27 of the dummy dielectric layer 15 and source and drain contact metal layers 62 and 65 are formed in openings 56 and 57, to form ohmic contacts with source and drain regions 36 and 37. Thereafter, a metallic interconnect structure may be formed atop the configuration shown in FIG. 11 to provide access to the respective source and drain contact layers and to the gate 51.

As will be appreciated form the foregoing description, the yield-impacting potential of (ionic) impurities present in the atmosphere above the semiconductor substrate surface and induced radiation damage during device formation is obviated by the processing methodology of the present invention which effectively protects the surface of the substrate throughout the process of forming a self-aligned MESFET through substitutional gate processing. In the process according to the present invention, by not having completely etched through the dielectric layer at portions adjacent to the mesa, so as to leave a thin protective portion on the order of 500–1,000 Å, the entirety of the surface of the substrate is protected during subsequent device processing, including the reactive ion etch through which the sidewall spacers are formed. By completely etching through thickness of the non-selectively deposited insulator layer (except where the sidewall spacers are formed), those portions of the channel region whereat source and drain regions are ion - implanted will not be masked by a layer of substantial thickness that would otherwise require increased implantation energy, but rather are protected by the reduced thickness (500–1,000 Å) portions of the dielectric layer, thereby affording the use of reduced implantation energies and improving device performance (shorted-channel-effect immunity) and the practicality of the process. Moreover, the dielectric layer is formed of the same material throughout, thereby simplifying the process step sequence and controllability of device formation.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A method of manufacturing a semiconductor device comprising the steps of:
   (a) providing a semiconductor substrate;
   (b) forming a first layer of insulator material on the surface of said semiconductor substrate, such that said first layer of insulator material has a first portion of a first thickness overlying a first surface portion of said semi-conductor substrate and a second portion of a second thickness on the order of 500–1000 Å overlying a second surface portion of said semiconductor substrate adjacent thereto, said first thickness being larger than said thickness so as to have sidewalls extending above said second portion of said first layer;
   (c) forming sidewalls spacers contiguous with the sidewalls of said first portion of said first layer of insulator material so as to overlie surface portions of said second portion of said first layer of insulator material adjacent to said first portion of said first layer of insulator material;
   (d) introducing impurities of a prescribed conductivity type into said substrate using said first portion of said first layer of insulator material, said sidewall spacers and material of said second portion of said first layer beneath said sidewall spacers as a mask, thereby forming first and second regions of said prescribed conductivity type in respective first and second zones of said surface portion of said substrate spaced apart from said first surface portion thereof;
   (e) removing said first portion of said first insulator layer, so as to expose said first surface portion of said substrate therebeneath; and
   (f) forming a conductive layer on said first surface portion of said substrate exposed by the removal of said first portion of said first insulator layer in step (e).

2. A method according to claim 1, wherein step (e) includes the step of removing said sidewall spacers.

3. A method according to claim 2, wherein step (e) further comprises forming a protective layer on said second portion of said first layer of insulator material, and etching said first portion of said first layer of insulator material, using said protective layer as a mask therefor.

4. A method according to claim 3, wherein step (f) comprises the steps of non-selectively depositing conductive material on said first protective layer and on said exposed first surface portion of said substrate, and lifting off said protective layer, thereby causing the removal of conductive material deposited thereon, while leaving conductive material on said first surface portion of said substrate to thereby form said conductive layer on said first surface portion of said substrate.

5. A method according to claim 4, wherein step (e) comprises forming said protective layer of a height at least as great as that of said first portion of said first layer of insulator material, so as to form a planarizing layer atop said first layer of insulating material, and thereafter nonselectively etching said protective layer so as to expose said first portion of said first layer of insulator material.

6. A method according to claim 1, wherein step (a) comprises the step of providing a semiconductor substrate having formed therein a surface region of said prescribed conductivity type beneath said first surface portion of said substrate and part of said second surface portion of said substrate adjacent thereto.

7. A method according to claim 6, wherein step (d) includes the steps of implanting ions of said prescribed conductivity type into said first and seconds zones of said second surface portion of said substrate to form said first and second regions of said prescribed conductivity type at an impurity concentration greater than that of said surface region.

8. A method according to claim 7, wherein step (b) comprises the steps of
 (b-1) non-selectively forming a first layer of insulator material on the surface of said semiconductor substrate, and
 (b-2) selectively removing material of said first layer of insulator material so as to leave said first layer of insulator material on said first and second portions having said first and second thicknesses, respectively.

9. A method according to claim 8, wherein said first thickness is on the order of at least 5000 Å and said second thickness is on the order of at least 500 Å.

10. A method according to claim 9, wherein step (e) further comprises forming a protective layer on said second portion of said first layer of insulator material, and etching said first portion of said first layer of insulator material, using said protective layer as a mask thereof.

11. A method according to claim 10, wherein step (f) comprises the steps of non-selectively depositing conductive material on said first protective layer and on said exposed first surface portion of said substrate, and lifting off said protective layer, thereby causing the removal of conductive material deposited thereon, while leaving conductive material on said first surface portion of said substrate to thereby form said conductive layer on said first surface portion of said substrate.

12. A method according to claim 1, wherein step (b) comprises the steps of
 (b-1) non-selectively forming a first layer of insulator material on the surface of said semiconductor substrate, and
 (b-2) selectively removing material of said first layer of insulator material so as to leave said first layer of insulator material on said first and second portions having said first and second thicknesses, respectively.

13. A method according to claim 12, wherein said first thickness is on the order of at least 5000 Å.

14. A method according to claim 1, wherein step (d) includes the steps of implanting ions of said prescribed conductivity type into said substrate, and annealing the reasulting structure.

15. A method according to claim 1, wherein said substrate comprises a III–V compound semiconductor material.

16. A method according to claim 15, wherein said substrate comprises gallium arsenide.

17. A method of manufacturing a self-aligned gallium arsenide MESFET comprising the steps of:
 (a) forming a first semiconductor region of a prescribed conductivity type in a first surface portion of a gallium arsenide substrate;
 (b) forming a first layer of insulator material on the surface of said gallium arsenide substrate;
 (c) selectively removing insulator material from said first layer, so as to leave a substitutional gate of portion having a first thickness overlying a first surface portion of said first semiconductor region and a protective portion, contiguous with said substitutional gate portion, having a second thickness on the order of 500–1,000 Å overlying a second surface portion of said first semiconductor region, contiguous with said first surface portion thereof, and a second surface of said substrate contiguous with said first surface portion thereof, said second thickness being less than said first thickness so that said substitutional gate portion of said first layer of insulator material has sidewalls extending above said protective portion of said first layer;
 (d) forming sidewall spacers contiguous with the sidewalls of said substitutional gate portion of said first layer of insulator material so as to overlie surface portions of said protective portion of first layer of insulator material contiguous with said substitutional gate portion thereof;
 (e) implanting ions of said prescribed conductivity type into said gallium arsenide substrate using said substitutional gate portion, said sidewall spacers and material of said protective portion of said first layer of insulator material beneath said sidewall spacers as a mask, thereby forming second and third semiconductor regions of said prescribed conductivity type and an impurity concentration greater than that of said first region respective first and second zones of said first region spaced apart from said first surface portion of said first semiconductor region;
 (f) annealing the structure resulting from step (e);
 (g) removing said substitutional gate portion of said first insulator layer and said sidewall spacers contiguous therewith;
 (h) forming a conductive gate layer on said first surface portion of said first semiconductor region so as to form a Schottky barrier with said first semiconductor region;
 (i) forming apertures in said protective portion of said first layer of insulating material to expose surface portions of said second and third regions; and
 (j) forming ohmic contacts to said second and third regions through said apertures.

18. A method according to claim 17, wherein said first thickness of said substitutional gate portion of said first insulator layer is at least 5,000 Å.

19. A method according to claim 17, wherein step (d) comprises the steps of
 (d-1) non-selectively depositing a second layer of insulator material over said first layer of insulator material, and
 (d-2) etching the structure resulting from step (d-1) so as to expose said first layer of insulator material except at said sidewalls of said first portion thereof whereat said sidewall spacers formed of said second layer of insulator material remain.

20. A method according to claim 17, wherein step (g) comprises the steps of
 (g-1) removing said sidewalls spacers;
 (g-2) forming a second layer of insulator material over said protective portion of said first layer of insulator material and contiguous with the sidewalls of said substitutional gate portion thereof, and (g-3) etching said substitutional gate portion of said first layer of insulator material using said second layer of insulator material as a mask therefor.

21. A method according to claim 20, wherein step (h) comprises the steps of (h-1) non-selectively depositing a metallic layer over the structure resulting from step (g-3), so as to deposit a gate metal layer on said first surface portion of said first semiconductor region and a metal layer on said second layer of insulator material, and (h-2) lifting off said second layer of insulator material and the metal formed thereon in step (h-1).

* * * * *